(12) United States Patent
Chang

(10) Patent No.: US 8,508,024 B2
(45) Date of Patent: Aug. 13, 2013

(54) CHIP PACKAGE STRUCTURE AND PACKAGE SUBSTRATE

(75) Inventor: Wen-Yuan Chang, Taipei Hsien (TW)

(73) Assignee: VIA Technologies, Inc, New Taipei (TW)

( * ) Notice: Subject to any disclaimer, the term of this patent is extended or adjusted under 35 U.S.C. 154(b) by 357 days.

(21) Appl. No.: 12/947,769

(22) Filed: Nov. 16, 2010

(65) Prior Publication Data

US 2011/0169147 A1     Jul. 14, 2011

Related U.S. Application Data

(60) Provisional application No. 61/294,491, filed on Jan. 13, 2010.

(30) Foreign Application Priority Data

Apr. 9, 2010 (TW) ................................ 99111124 A

(51) Int. Cl.
*H01L 23/495* (2006.01)

(52) U.S. Cl.
USPC ..... 257/668; 257/650; 257/773; 257/E23.033

(58) Field of Classification Search
USPC .................................................. 257/650–733
See application file for complete search history.

(56) References Cited

U.S. PATENT DOCUMENTS

| 2002/0066948 | A1* | 6/2002 | Kim ............................. | 257/678 |
| 2010/0116529 | A1* | 5/2010 | Niki ............................. | 174/257 |
| 2010/0140759 | A1* | 6/2010 | Pagaila et al. ................. | 257/660 |

FOREIGN PATENT DOCUMENTS

| CN | 1747156 | 3/2006 |
| CN | 101236934 | 8/2008 |
| TW | 200737472 | 10/2007 |
| TW | 200834849 | 8/2008 |
| TW | 200929479 | 7/2009 |

OTHER PUBLICATIONS

"First Office Action of China Counterpart Application", issued on Apr. 25, 2011, p. 1-p. 5.
"Office Action of Taiwan Counterpart Application", issued on Jan. 22, 2013, p. 1-p. 7.

* cited by examiner

*Primary Examiner* — Mamadou Diallo
(74) *Attorney, Agent, or Firm* — Jianq Chyun IP Office

(57) ABSTRACT

A chip package structure for being disposed on a carrier includes a package substrate and a chip. The package substrate includes a laminated layer, a patterned conductive layer, a solder-mask layer, at least one outer pad and a padding pattern. The patterned conductive layer is disposed on a first surface of the laminated layer and has at least one inner pad. The solder resist layer is disposed on the first surface and has at least one opening exposed the inner pad. The outer pad is disposed on the solder resist layer, located within the opening, and is connected with the inner pad. The padding pattern is disposed on the solder resist layer. A height of the padding pattern relative to the first surface is greater than that of the outer pad. The chip is located on a second surface of the laminated layer and electrically connected to the package substrate.

15 Claims, 3 Drawing Sheets

CHIP PACKAGE STRUCTURE AND PACKAGE SUBSTRATE

CROSS-REFERENCE TO RELATED APPLICATION

This application claims the priority benefit of U.S. provisional application Ser. No. 61/294,491, filed on Jan. 13, 2010 and Taiwan application serial no. 99111124, filed on Apr. 9, 2010. The entirety of each of the above-mentioned patent applications is hereby incorporated by reference herein and made a part of specification.

BACKGROUND OF THE INVENTION

1. Field of the Invention

The present invention relates to a chip packaging technology, and more particularly, to a package substrate and a chip package structure employing such the package substrate.

2. Description of Related Art

Package substrates are a packaging component often used in current semiconductor packaging technology. The package substrate includes a plurality of patterned conductive layers and a plurality of dielectric layers alternatingly laminated with each other, and the adjacent layers can be electrically connected by the conductive vias. The two outmost patterned conductive layers respectively on the opposite surfaces of the package substrate include a plurality of pads. The package substrate further includes two solder-mask layers that cover the two outmost patterned conductive layers, respectively. These solder-mask layers have a plurality of openings. The openings expose portions of the pads, respectively, to define bonding areas of the pads.

A chip may be assembled onto the package substrate by flip-chip bonding or wire bonding to form a chip package structure. In addition, the package substrate may further be assembled to an external component (e.g. a printed circuit board) via solder balls disposed on the pads of the package substrate. However, when the bonding area of the pad is defined by the opening of the solder-mask layer, i.e. the pad is of a solder-mask-defined (SMD) type, the solder ball contacts only portion of the pad. Therefore, the solder ball may not be stably adhered onto the pad, thus degrading the reliability of the chip package structure. In addition, fabrication process needs to vary based on the structure requirements of different package substrates.

SUMMARY OF THE INVENTION

Accordingly, the present invention is directed to a package substrate having improved reliability.

The present invention is also directed to a chip package structure which includes the above-mentioned package substrate thus having improved reliability.

The present invention provides a chip package structure adapted to be disposed on a carrier. The chip package structure includes a package substrate and a chip. The package substrate includes a laminated layer, a patterned conductive layer, a solder-mask layer, at least one outer pad and a padding pattern. The laminated layer has a first surface and a second surface opposite to each other. The patterned conductive layer is disposed on the first surface of the laminated layer and includes at least one inner pad. The solder-mask layer is disposed on the first surface of the laminated layer and has at least one opening from which the inner pad is exposed. The outer pad is disposed on the solder-mask layer and within the opening. The outer pad is connected with the inner pad exposed from the opening. The padding pattern is disposed on the solder-mask layer. A height of the padding pattern relative to the first surface of the laminated layer is greater than a height of the outer pad relative to the first surface of the laminated layer. The outer pad does not contact the carrier when the package substrate is disposed on the carrier with the padding pattern. The chip is disposed on the package substrate. The chip is located on the second surface of the laminated layer and electrically connected to the package substrate.

The present invention additionally provides a chip package structure adapted to be connected to an electronic component. The chip package structure includes a package substrate, a chip, and at least one solder ball. The package substrate includes a laminated layer, a patterned conductive layer, a solder-mask layer, at least one outer pad and a padding pattern. The laminated layer has a first surface and a second surface opposite to each other. The patterned conductive layer is disposed on the first surface of the laminated layer and includes at least one inner pad. The solder-mask layer is disposed on the first surface of the laminated layer and has at least one opening from which the inner pad is exposed. The outer pad is disposed on the solder-mask layer and within the opening. The outer pad is connected with the inner pad exposed from the opening. The padding pattern is disposed on the solder-mask layer. A height of the padding pattern relative to the first surface of the laminated layer is greater than a height of the outer pad relative to the first surface of the laminated layer. The chip is disposed on the package substrate. The chip is located on the second surface of the laminated layer and electrically connected to the package substrate. The solder ball is connected with the outer pad. The padding pattern does not contact the electronic component when the package substrate is connected to the electronic component via the solder ball.

The present invention further provides a package substrate including a laminated layer, a patterned conductive layer, a solder-mask layer, at least one outer pad and a padding pattern. The laminated layer has a surface. The patterned conductive layer is disposed on the surface of the laminated layer and includes at least one inner pad. The solder-mask layer is disposed on the surface of the laminated layer and has at least one opening from which the inner pad is exposed. The outer pad is disposed on the solder-mask layer and within the opening. The outer pad is connected with the inner pad exposed from the opening. The padding pattern is disposed on the solder-mask layer. A height of the padding pattern relative to the surface of the laminated layer is greater than a height of the outer pad relative to the surface of the laminated layer.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1A:
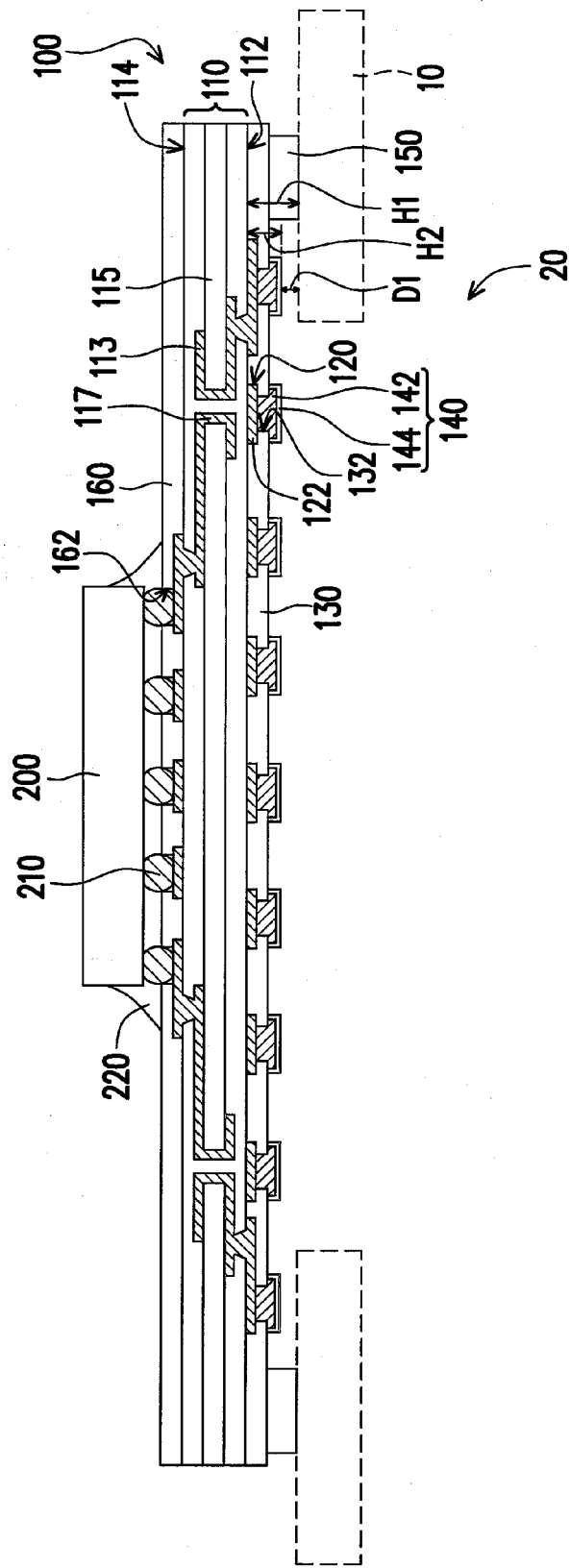
FIG. 1A is a cross-sectional view of a chip package structure according to one embodiment of the present invention.

FIG. 1A is a cross-sectional view of a chip package structure according to one embodiment of the present invention.

Figure 1B:
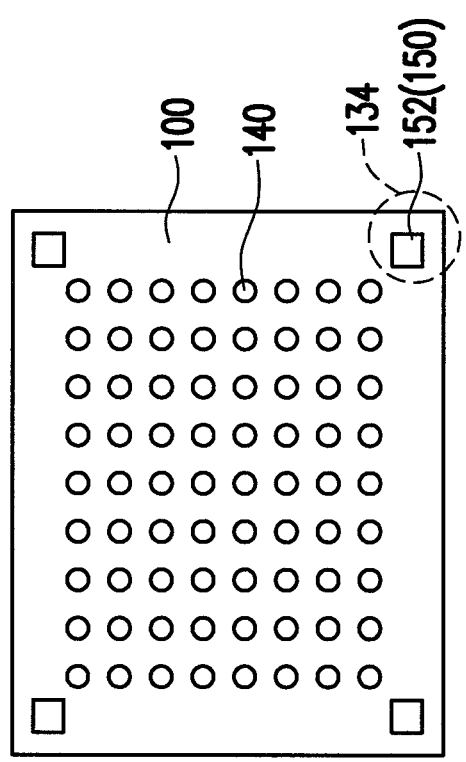
FIG. 1B is a bottom view of the package substrate of FIG. 1A.

FIG. 1B is a bottom view of the package substrate of FIG. 1A. Referring to FIG. 1A, the chip package structure 20 includes a package substrate 100 and a chip 200 assembled to the package substrate 100. In particular, in the present embodiment, the package substrate 100 or the chip package structure 20 having the chip 200 assembled thereto are adapted to be disposed on a carrier 10. This carrier 10 is, for example, a carrier for delivery of the package substrate 100 or the chip package structure 20 during the packaging process.

The package substrate 100 includes a laminated layer 110, a patterned conductive layer 120, a solder-mask layer 130, at least one outer pad 140 (a plurality of pads 140 are illustrated in FIG. 1A), and a padding pattern 150 (two padding patterns 150 are illustrated in FIG. 1A). The laminated layer 110 has a first surface 112 and a second surface 114 opposite to the first surface 112. In the present embodiment, the laminated layer 110 is formed by a plurality of patterned conductive layers 113 and a plurality of dielectric layers 115 alternatingly laminated with each other, and the patterned conductive layers 113 are electrically connected to one another through at least one conductive via 117.

The outer patterned conductive layer 120 is disposed on the first surface 112 of the laminated layer 110, and the outer patterned conductive layer 120 includes at least one inner pad 122 (a plurality of pads 122 are illustrated in FIG. 1A). The solder-mask layer 130 is disposed on the first surface 112 of the laminated layer 110, and the solder-mask layer 130 has at least one opening 132 (a plurality of openings 132 are illustrated in FIG. 1A). The inner pads 122 are exposed from these openings 132, respectively. These outer pads 140 are disposed on the solder-mask layer 130 and within these corresponding openings 132, respectively. The outer pads 140 are physically and electrically connected to the inner pads 122 exposed from the corresponding openings 132, respectively.

In the present embodiment, each outer pad 140 includes a main portion 142 and a metal protective layer 144. The main portions 142 are connected to these inner pads 122, respectively. The metal protective layers 144 cover exposed surfaces of the main portions 142, respectively, and act as anti-oxidation layers for the main portions 142. The metal protective layer 144 described herein may, for example, be a nickel-gold layer, nickel-palladium-gold layer nickel-tin layer, palladium layer, gold layer, or of another suitable metal, and is not intended to be limited to any particular metal material described herein.

The padding patterns 150 are disposed on the first surface 112 of the laminated layer 110. In the present embodiment, the padding patterns 150 are disposed on the solder-mask layer 130. In particular, a height H1 of the padding patterns 150 relative to the first surface 112 of the laminated layer 110 is greater than a height H2 of the outer pads 140 relative to the first surface 112 of the laminated layer 110. In other words, with respect to the first surface 112 of the laminated layer 110, top surfaces of the padding patterns 150 are higher than top surfaces of the outer pads 140. Therefore, when the package substrate 100 is disposed on the carrier 10 with these padding patterns 150, the outer pads 140 do not contact the carrier 10, i.e. a distance D1 is formed between the outer pads 140 and the carrier 10. Instead, it is the padding patterns 150 that contact the carrier 10. The outer pads 140 are conductive structures and designed to be electrically connected with the outer patterned conductive layer 120, the multiple patterned conductive layers 113 of the laminated layer 110, and the chip 200. If the carrier 10 (e.g. the carrier for delivery of the package substrate or the chip package structure during the packaging process) carries static current or other undesirable current, these padding patterns 150 can effectively avoid chip 200 damage caused by the static current or other undesirable current conducted through the outer pads 140, outer patterned conductive layer 120, and a plurality of patterned conductive layers 113 of the laminated layer 110 to the chip 200 due the contact between the outer pads 140 and the carrier 10.

Referring to FIG. 1B, in the present embodiment, the padding patterns 150 include a plurality of padding points 152 distributed at a plurality of corners 134 (only four corners 134 are illustrated in FIG. 1B) of the solder-mask layer 130. That is, the padding patterns 150 of the present embodiment are distributed at the corners 134 of the solder-mask layer 130 in point or non-continuous distribution pattern. In other embodiments not illustrated, the padding patterns 150 may also be distributed along a periphery of the solder-mask layer 130 in continuous distribution pattern. For example, these padding patterns 150 are distributed in strip pattern, or in strip-point combination pattern. In other words, the present invention does not limit the shapes of the padding patterns 150. Other known shape designs that can likewise improve reliability of the package substrate 100 can be adopted and therefore fall within the scope of the present invention. Besides, the material of the padding patterns 150 is, for example, a solder-mask material.

Referring to FIG. 1A again, the chip 200 is disposed on the second surface 114 of the laminated layer 110 and electrically connected to the package substrate 100. In the present embodiment, the package substrate 100 further includes a solder-mask layer 160 disposed on the second surface 114 of the laminated layer 110. The solder-mask layer 160 has at least one opening 162 (a plurality of openings 162 are illustrated in FIG. 1A). Portions of the patterned conductive layer 113 disposed on the second surface are exposed from the openings 162, respectively.

The chip package structure 20 further includes a plurality of bumps 210 and a encapsulant 220. The bumps 210 are disposed between the chip 200 and the package substrate 100 and located on the patterned conductive layer 113 portions exposed from the openings 162, respectively. The chip 200 is electrically connected with the package substrate 100 with these bumps 210. In addition, the encapsulant 220 is filled between the chip 200 and the package substrate 100 and the encapsulant 220 encapsulates the bumps 210.

In the present embodiment, the chip 200 is electrically connected to the package substrate 100 by flip-chip bonding. In another embodiment not illustrated, the chip 200 may be electrically connected to the package substrate 100 by wire bonding or in another manner.

In the present embodiment, the package substrate 100 includes the outer pads 140 connected with the inner pads 122, respectively. Therefore, in comparison with the conventional pad regions defined by openings of the solder-mask layer, the outer pads 140 disposed on the solder-mask layer 130 of the present embodiment can have a larger pad area compared to the area of the inner pad 122 exposed by the opening 132.

In addition, the package substrate 100 of the present embodiment has these padding patterns 150, and the height of the padding patterns 150 relative to the first surface 112 of the laminated layer 110 is greater than the height of the outer pads 140 relative to the first surface 112 of the laminated layer 110 (i.e. the top surfaces of the padding patterns 150 are higher than the top surfaces of the outer pads 140). Therefore, when the package substrate 100 is disposed on the carrier 10 with these padding patterns 150, contact between the outer pads 140 and the carrier 10 can be avoided to reduce the possibility of the static current or other undesirable current flowing through the outer pads 140 to the chip 200, thereby improving the reliability of the package structure after the chip 200 is assembled to the package substrate 100.

Figure 2:
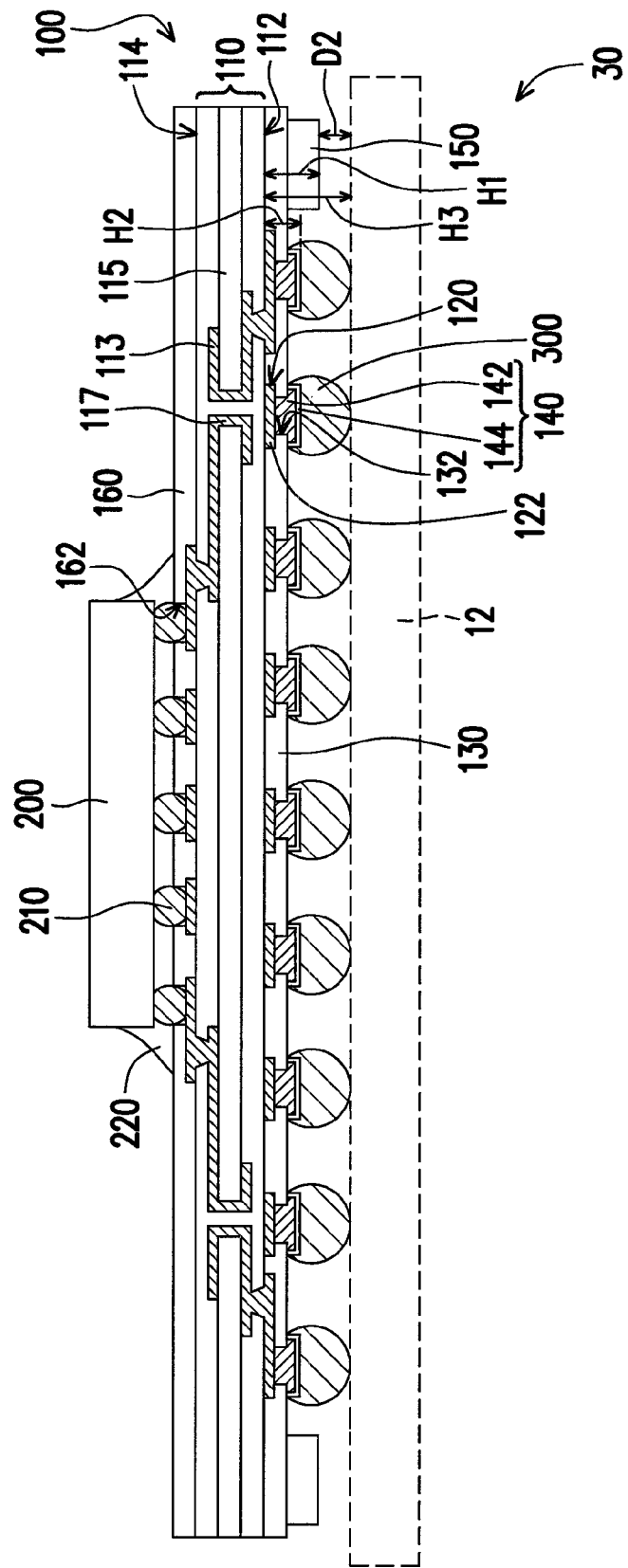
FIG. 2 is a cross-sectional view of a chip package structure according to another embodiment of the present invention.

FIG. 2 is a cross-sectional view of a chip package structure according to another embodiment of the present invention. In describing this embodiment, the reference numerals and part of the content of the previous embodiment are used, where the same reference numerals refer to the same or similar elements. In addition, the description regarding the part that is the same as the previous embodiment is not repeated herein.

Referring to FIG. 2, the chip package structure 30 of the present embodiment is similar to the chip package structure 20 of the previous embodiment, with the difference being that the chip package structure 30 of FIG. 2 further includes at least one solder ball 300 (a plurality of solder balls 300 are illustrated in FIG. 2), and the solder balls 300 are connected to the outer pads 140, respectively, such that the outer pads 140 are electrically connected with an external element 12 through these solder balls 300.

Specifically, the height H1 of the padding patterns 150 relative to the first surface 112 of the laminated layer 110 is less than the height H3 of the solder balls 300 relative to the first surface 112 of the laminated layer 110. In other words, with respect to the first surface 112 of the laminated layer 110, the top surfaces of the padding patterns 150 are lower than top surfaces of the solder balls 300. In the present embodiment, the height of the padding patterns 150 relative to the solder-mask layer 130 is less than a half of the height of the solder balls 300 relative to the solder-mask layer J30. Therefore, when the solder balls 300 of the chip package structure 30 is to be connected with an external electronic component 12, these padding patterns 150 do not contact the external electronic element 12. That is, a distance D2 is formed between the padding patterns 150 and the external electronic element 12. Therefore, the padding patterns 150 do not affect the connection of the solder balls 300 and the external electronic component 12. In one embodiment, the external electronic component 12 is, for example, a circuit substrate, an electronic package or another electronic component.

In summary, the package substrate includes the outer pads that are connected with the inner pads, respectively. Therefore, in comparison with the conventional pad region that is defined by the openings of the solder-mask layer, a larger contact area between each solder ball and one corresponding outer pad can be achieved in the present embodiment, which can thus increase the reliability of package structure after the solder balls are assembled to the package substrate. In addition, the package substrate of the present embodiment has these padding patterns and the height of the padding patterns relative to the surface of the laminated layer is greater than the height of the outer pads relative to the surface of the laminated layer. Therefore, when the package substrate is disposed on the carrier with these padding patterns, the outer pads can be prevented from contacting the carrier, thus increasing the reliability of the package structure after the chip is packaged onto the package substrate. Furthermore, the package substrate of the present embodiment has these padding patterns and the height of the padding patterns relative to the laminated layer is less than the height of the solder balls relative to the surface of the laminated layers. Therefore, when the package substrate is connected to external electronic components through these solder balls, these padding patterns do not affect the connection between the solder balls and the external electronic components.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A chip package structure adapted to be disposed on a carrier, the chip package structure comprising:
   a package substrate comprising:
      a laminated layer having a first surface and a second surface opposite to each other;
      a patterned conductive layer disposed on the first surface of the laminated layer and comprising at least one inner pad;
      a solder-mask layer disposed on the first surface of the laminated layer and having at least one opening from which the inner pad is exposed;
      at least one outer pad disposed on the solder-mask layer and within the opening, wherein the outer pad is connected with the inner pad exposed from the opening, and the at least one outer pad is adapt to be connected with at least one solder ball of the chip package structure to connect the chip package structure and an electronic component; and
      a padding pattern disposed on the solder-mask layer, wherein a height of the padding pattern relative to the first surface of the laminated layer is greater than a height of the outer pad relative to the first surface of the laminated layer, the outer pad does not contact the carrier when the package substrate is disposed on the carrier with the padding pattern, and the padding pattern does not contact the electronic component when the package substrate is connected with the electronic component via the solder ball; and
   a chip disposed on the package substrate, the chip located on the second surface of the laminated layer and electrically connected to the package substrate.

2. The chip package structure according to claim 1, wherein a distance is formed between the outer pad and the carrier.

3. The chip package structure according to claim 1, wherein the padding pattern is distributed at a plurality of corners of the solder-mask layer.

4. The chip package structure according to claim 1, wherein the material of the padding pattern is solder-mask material.

5. A chip package structure adapted to be connected with an electronic component, the chip package structure comprising:
- a package substrate comprising
  - a laminated layer having a first surface and a second surface opposite to each other;
  - a patterned conductive layer disposed on the first surface of the laminated layer and comprising at least one inner pad;
  - a solder-mask layer disposed on the first surface of the laminated layer and having at least one opening from which the inner pad is exposed;
  - at least one outer pad disposed on the solder-mask layer and within the opening, wherein the outer pad is connected with the inner pad exposed from the opening; and
  - a padding pattern disposed on the solder-mask layer, wherein a height of the padding pattern relative to the first surface of the laminated layer is greater than a height of the outer pad relative to the first surface of the laminated layer;
- a chip disposed on the package substrate, the chip located on the second surface of the laminated layer and electrically connected to the package substrate; and
- at least one solder ball connected with the outer pad, wherein the padding pattern does not contact the electronic component when the package substrate is connected to the electronic component via the solder ball.

6. The chip package structure according to claim 5, wherein a distance is formed between the padding pattern and the electronic component when the solder ball is connected to the electronic component.

7. The chip package structure according to claim 5, wherein the height of the padding pattern relative to the first surface of the laminated layer is less than a height of the solder ball relative to the first surface of the laminated layer.

8. The chip package structure according to claim 5, wherein a height of the padding pattern relative to the solder-mask layer is at least less than a half of a height of the solder ball relative to the solder-mask layer.

9. The chip package structure according to claim 5, wherein the padding pattern is distributed at a plurality of corners of the solder-mask layer.

10. The chip package structure according to claim 5, wherein the chip package structure is adapted to be disposed on a carrier, and the outer pad does not contact the carrier when the package substrate is disposed on the carrier with the padding pattern.

11. The package according to claim 5, wherein the electronic component is a circuit substrate or an electronic package.

12. The chip package structure according to claim 5, wherein the material of the padding pattern is solder-mask material.

13. A package substrate comprising:
- a laminated layer having a surface;
- a patterned conductive layer disposed on the surface of the laminated layer and comprising at least one inner pad;
- a solder-mask layer disposed on the surface of the laminated layer and having at least one opening from which the inner pad is exposed;
- at least one outer pad disposed on the solder-mask layer and within the opening, wherein the outer pad is connected with the inner pad exposed from the opening, and the at least one outer pad is adapt to be connected with at least one solder ball of the chip package structure to connect the chip package structure and an electronic component; and
- a padding pattern disposed on the solder-mask layer, wherein a height of the padding pattern relative to the surface of the laminated layer is greater than a height of the outer pad relative to the surface of the laminated layer, and the padding pattern does not contact the electronic component when the package substrate is connected with the electronic component via the solder ball.

14. The package substrate according to claim 13, wherein the padding pattern is distributed at a plurality of corners of the solder-mask layer.

15. The chip package structure according to claim 13, wherein the material of the padding pattern is solder-mask material.

* * * * *